United States Patent
Nakamura

(10) Patent No.: US 9,153,766 B2
(45) Date of Patent: Oct. 6, 2015

(54) MULTI-LAYER PIEZOELECTRIC ELEMENT WITH STRESS RELAXING, AND INJECTION DEVICE AND FUEL INJECTION SYSTEM USING THE SAME

(75) Inventor: Shigenobu Nakamura, Kirishima (JP)

(73) Assignee: Kyocera Corporation, Kyoto (JP)

(*) Notice: Subject to any disclaimer, the term of this patent is extended or adjusted under 35 U.S.C. 154(b) by 917 days.

(21) Appl. No.: 13/387,625

(22) PCT Filed: Jul. 28, 2010

(86) PCT No.: PCT/JP2010/062662
§ 371 (c)(1),
(2), (4) Date: Apr. 11, 2012

(87) PCT Pub. No.: WO2011/013689
PCT Pub. Date: Feb. 3, 2011

(65) Prior Publication Data
US 2012/0187211 A1    Jul. 26, 2012

(30) Foreign Application Priority Data
Jul. 28, 2009    (JP) .................. 2009-174957

(51) Int. Cl.
*H01L 41/083* (2006.01)
*F02M 51/06* (2006.01)
*H01L 41/273* (2013.01)
*F02M 63/02* (2006.01)

(52) U.S. Cl.
CPC ....... *H01L 41/0838* (2013.01); *F02M 51/0603* (2013.01); *H01L 41/273* (2013.01); *F02M 63/0225* (2013.01); *Y10T 29/42* (2015.01)

(58) Field of Classification Search
CPC .............. H01L 41/083; H01L 41/0833
USPC .................................................. 310/328, 365
See application file for complete search history.

(56) References Cited

U.S. PATENT DOCUMENTS

| 5,153,477 A | 10/1992 | Jomura et al. |
| 8,410,663 B2 | 4/2013 | Sakamoto et al. |
| 2003/0107301 A1 | 6/2003 | Asano et al. |
| 2008/0218028 A1* | 9/2008 | Dollgast et al. ............... 310/328 |

(Continued)

FOREIGN PATENT DOCUMENTS

| CN | 101253638 A1 | 8/2008 |
| DE | 102004012284 A1 * | 12/2004 |

(Continued)

OTHER PUBLICATIONS

Chinese Office Action, Chinese Patent Application No. 201080032775.7, Aug. 1, 2013, 7 pp.
European Search Report, European Patent Application No. 10804435.5, Feb. 24, 2014, 6 pp.
Chinese Office Action, Chinese Patent Application No. 201080032775.7, Mar. 12, 2014, 5 pp.

*Primary Examiner* — J. San Martin
(74) *Attorney, Agent, or Firm* — Volpe and Koenig, P.C.

(57) ABSTRACT

A multi-layer piezoelectric element includes a stacked body in which piezoelectric layers and internal electrode layers are alternately laminated and a stress relaxing layer is disposed at part of portions between the piezoelectric layers, and an external electrode that is bonded to a side face of the stacked body so as to make electrical connection with the internal electrode layers, the internal electrode layers being not exposed on the side face of the stacked body, but the stress relaxing layer being exposed on the side face of the stacked body.

9 Claims, 12 Drawing Sheets

(56) References Cited

U.S. PATENT DOCUMENTS

| | | | |
|---|---|---|---|
| 2008/0218029 A1* | 9/2008 | Dollgast et al. | 310/328 |
| 2008/0218032 A1* | 9/2008 | Okamoto et al. | 310/358 |
| 2009/0162706 A1* | 6/2009 | Okamura et al. | 429/12 |
| 2009/0278422 A1* | 11/2009 | Florian et al. | 310/326 |
| 2010/0013359 A1 | 1/2010 | Shoji et al. | |
| 2010/0019620 A1* | 1/2010 | Kastl et al. | 310/311 |
| 2010/0026144 A1* | 2/2010 | Kastl et al. | 310/366 |
| 2010/0194247 A1* | 8/2010 | Dollgast et al. | 310/366 |
| 2010/0225204 A1 | 9/2010 | Hamann et al. | |
| 2010/0294853 A1* | 11/2010 | Okamura | 239/102.2 |
| 2010/0320284 A1* | 12/2010 | Okamura | 239/102.2 |
| 2010/0320876 A1* | 12/2010 | Dernovsek et al. | 310/364 |
| 2010/0327704 A1* | 12/2010 | Sakamoto et al. | 310/365 |
| 2011/0006644 A1* | 1/2011 | Kuegerl et al. | 310/364 |
| 2011/0181155 A1* | 7/2011 | Gabl et al. | 310/366 |

FOREIGN PATENT DOCUMENTS

| | | | |
|---|---|---|---|
| DE | 102007008120 A1 | 8/2008 | |
| GB | 2242312 A | 9/1991 | |
| JP | 3248483 A | 11/1991 | |
| JP | 7106654 A | 4/1995 | |
| JP | 2001267646 A | 9/2001 | |
| JP | 3900918 B2 | 4/2007 | |
| JP | 2008066391 A | 3/2008 | |
| WO | WO 2006077245 A1 * | 7/2006 | |
| WO | 2007102369 A1 | 9/2007 | |
| WO | 2008047460 A1 | 4/2008 | |
| WO | WO 2008072768 A1 * | 6/2008 | H01L 41/083 |

* cited by examiner

FIG. 6
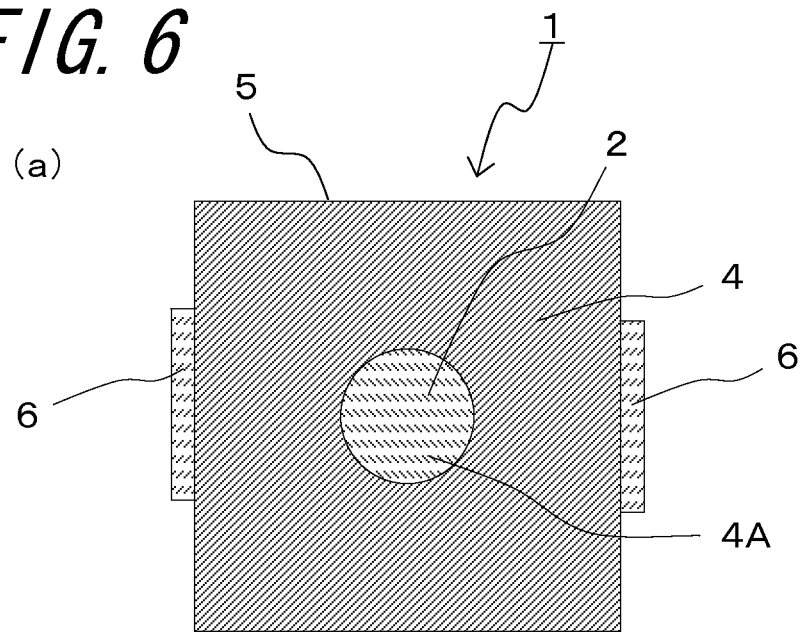
(a)
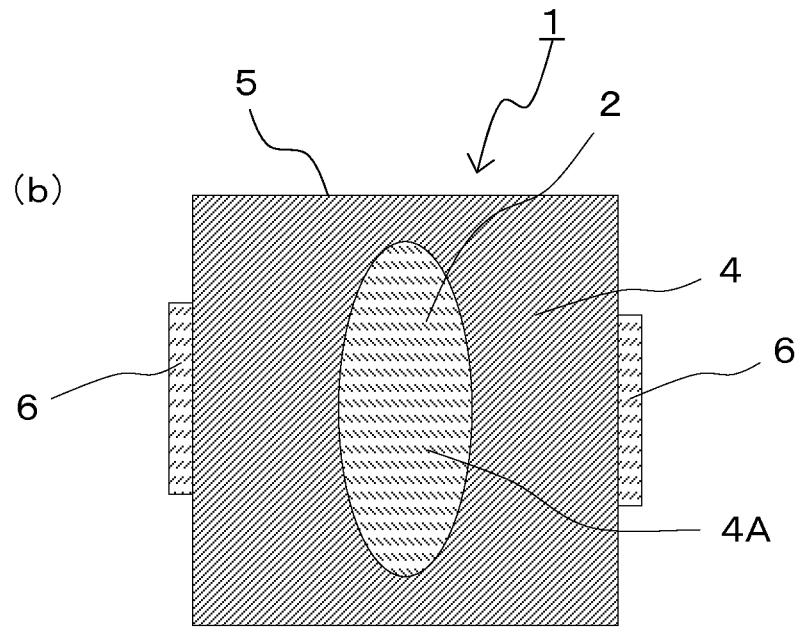
(b)

FIG. 7
(a)
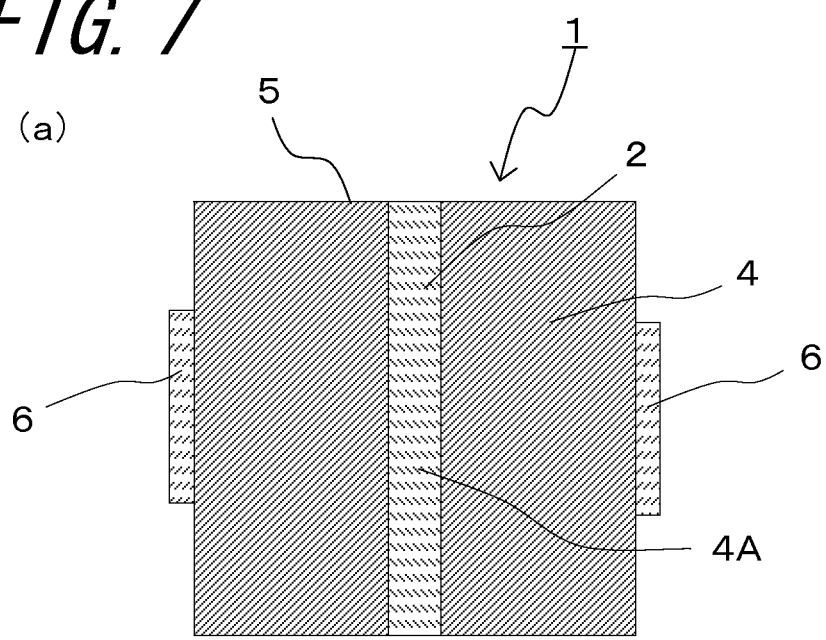
(b)
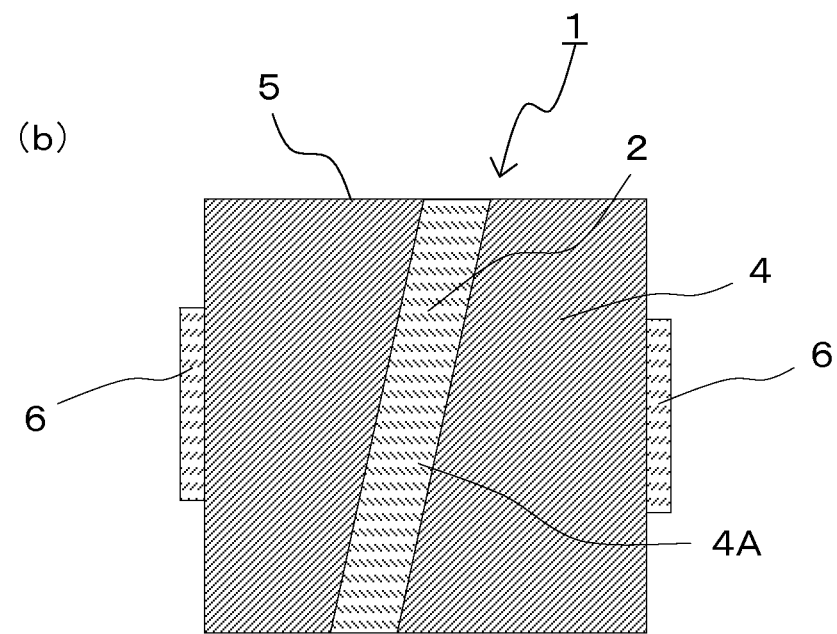

FIG. 10
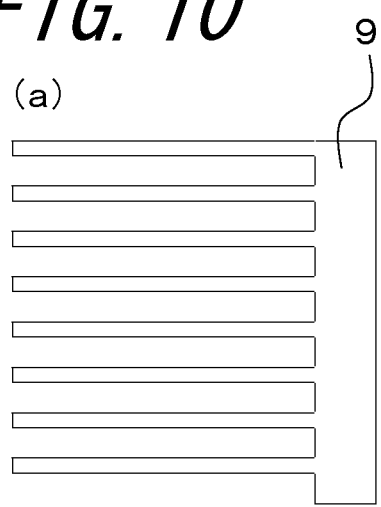
(a)
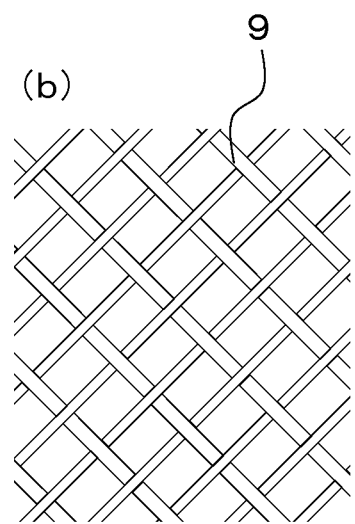
(b)
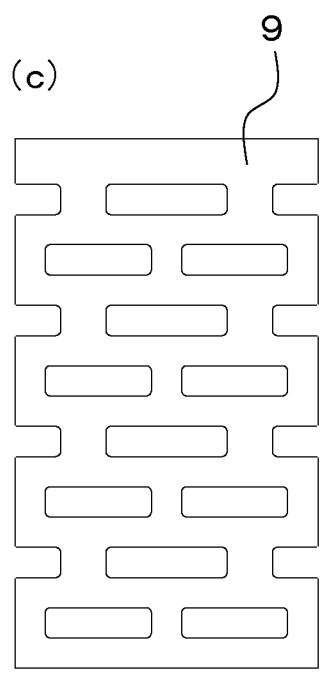
(c)
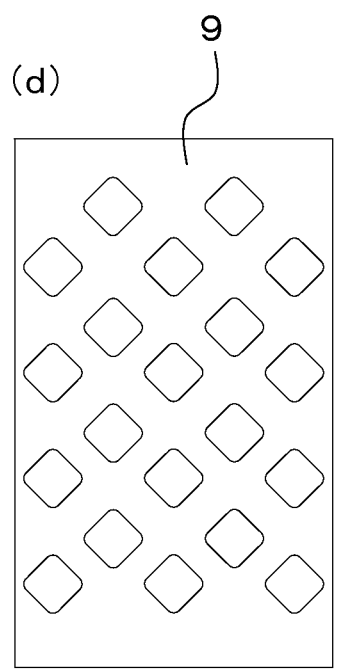
(d)

MULTI-LAYER PIEZOELECTRIC ELEMENT WITH STRESS RELAXING, AND INJECTION DEVICE AND FUEL INJECTION SYSTEM USING THE SAME

TECHNICAL FIELD

The present invention relates to a multi-layer piezoelectric element that can be used as, for example, a piezoelectric driving element (piezoelectric actuator), a pressure sensor element, and a piezoelectric circuit element.

BACKGROUND ART

A conventional multi-layer piezoelectric element has, for example, a stacked body in which piezoelectric layers and internal electrode layers are alternately laminated; and a pair of external electrodes configured to bond to side faces of the stacked body so as to make electrical connection with the internal electrode layers that are set so as to have alternately opposite polarities and are linked to the side faces.

On side faces of the stacked body on which no external electrode is formed, internal electrode layers sandwiching a piezoelectric layer therebetween and set so as to have as large an area as possible may be exposed. In that case, in order to prevent electric discharge on the side faces, the side faces of the stacked body are coated with an insulating resin so as to cover the exposed end portions of the internal electrode layers.

CITATION LIST

Patent Literature

Patent Literature 1: Japanese Examined Patent Publication JP-B2 3900918

DISCLOSURE OF INVENTION

Technical Problem

However, when the multi-layer piezoelectric element is used as a piezoelectric actuator in a fuel injection device (injector), for example, in an internal combustion engine of an automobile, that is, when used under severe conditions in which driving operation is continuously performed at a high temperature, it cannot be assured that the coating with a resin provides absolutely sufficient thermal resistance, which results in the problem that electric discharge may occur between the internal electrode layers on the side faces of the stacked body.

Furthermore, when considering the case in which the multi-layer piezoelectric element is used in water or a chemical agent, it is difficult to reliably prevent the intrusion of the water or the chemical agent by the resin, which, in a similar manner, results in the problem that electric discharge may occur between the internal electrode layers on the side faces of the stacked body.

Meanwhile, in order to avoid these problems, a configuration is conceivable in which the internal electrode layers are not exposed on side faces of the stacked body. In this case, when the stacked body of the multi-layer piezoelectric element is extended, stress applied to a piezoelectrically inactive portion, which is part of the piezoelectric layers without the internal electrode layers, causes a crack between the piezoelectric layers of the stacked body, and the crack extends to an interlayer between the internal electrode layers, which results in the problem that a short circuit may occur between positive and negative internal electrode layers.

The invention has been devised in view of the above-described conventional problems, and it is an object thereof to provide a highly durable multi-layer piezoelectric element in which a crack does not extend inside the stacked body even under a severe environment.

Solution to Problem

A multi-layer piezoelectric element of the invention comprises: a stacked body in which piezoelectric layers and internal electrode layers are alternately laminated and a stress relaxing layer is disposed at part of portions between the piezoelectric layers; and an external electrode configured to bond to a side face of the stacked body so as to make electrical connection with the internal electrode layers, wherein the internal electrode layers are not exposed on the side face of the stacked body, but the stress relaxing layer exposes on the side face of the stacked body.

Moreover, an injection device of the invention comprises: a container comprising an injection hole; and the multi-layer piezoelectric element mentioned above, wherein a fluid stored in the container is configured to be injected through the injection hole by driving operation of the multi-layer piezoelectric element.

Moreover, a fuel injection system of the invention comprises: a common rail configured to store a high-pressure fuel; the injection device mentioned above configured to inject the high-pressure fuel stored in the common rail; a pressure pump configured to supply the high-pressure fuel to the common rail; and an injection control unit configured to send a drive signal to the injection device.

Moreover, a method for manufacturing a multi-layer piezoelectric element of the invention comprises the steps of: applying a first conductive paste for forming an internal electrode layer onto a center region of a main face of a first piezoelectric ceramic green sheet, and applying a second conductive paste for forming a dummy internal electrode layer onto a peripheral region of the main face of the first piezoelectric ceramic green sheet so as to surround the first conductive paste at a predetermined interval therefrom; applying a third conductive paste for forming a stress relaxing layer onto an entire main face of a second piezoelectric ceramic green sheet; forming a stacked compact by laminating the first and second piezoelectric ceramic green sheet in a predetermined number; forming a stacked body in which piezoelectric layers and internal electrode layers each surrounded by the dummy internal electrode layer are alternately laminated and the stress relaxing layer is disposed at part of portions between the piezoelectric layers, by firing the stacked compact; and removing the dummy internal electrode layer together with a peripheral region of the piezoelectric layer, by grinding the side face of the stacked body.

Advantageous Effects of Invention

According to the invention, the multi-layer piezoelectric element includes: a stacked body in which piezoelectric layers and internal electrode layers are alternately laminated and a stress relaxing layer is disposed at part of portions between the piezoelectric layers; and an external electrode configured to bond to a side face of the stacked body so as to make electrical connection with the internal electrode layers, wherein the internal electrode layers are not exposed on the side face of the stacked body, but the stress relaxing layer exposes on the side face of the stacked body. Thus, since the stress relaxing layer exposes on the side face of the stacked body, it is possible to selectively cause a crack initially in the stress relaxing layer exposed on the side face of the stacked body, the crack being caused by stress that is repeatedly generated by extension and contraction of the stacked body when used in, for example, a fuel injection device (injector) in an internal combustion engine of an automobile, that is, when used under severe conditions in which driving operation is continuously performed in a state where a high electric field and a high pressure are applied for a long period of time. Thus, it is possible to eliminate the risk that a crack extending between the internal electrode layers will occur inside the stacked body causing a short circuit between the internal electrode layers.

Furthermore, since a crack that occurs in the stress relaxing layer reduces stress generated by extension of the stacked body, displacement of the stacked body is not restricted, and high displacement can be achieved.

Moreover, since the internal electrode layers exposes on the side face of the stacked body, electric discharge does not occur between the internal electrode layers on the side face of the stacked body even when used in, for example, a fuel injection device (injector) in an internal combustion engine of an automobile, that is, when used at a high temperature. In a similar manner, electric discharge does not occur between the internal electrode layers on the side face of the stacked body even when used in water or a chemical agent.

Thus, according to the multi-layer piezoelectric element of the invention, it is possible to provide a highly durable multi-layer piezoelectric element in which a crack does not extend inside the stacked body even under a severe environment.

According to the invention, the injection device includes: a container including an injection hole; and the multi-layer piezoelectric element of the invention, wherein a fluid stored in the container is configured to be injected through the injection hole by driving operation of the multi-layer piezoelectric element. Thus, it is possible to avoid that a crack extending between the internal electrode layers occurs inside the stacked body in the multi-layer piezoelectric element to cause a short circuit between the internal electrode layers. Furthermore, it is possible to prevent displacement of the stacked body from being restricted. Accordingly, it is possible to stably cause the fluid to be injected as desired for a long period of time.

According to the invention, the fuel injection system includes: a common rail configured to store a high-pressure fuel; the injection device of the invention configured to inject the high-pressure fuel stored in the common rail; a pressure pump configured to supply the high-pressure fuel to the common rail; and an injection control unit configured to send a drive signal to the injection device. Thus, it is possible to stably cause the high-pressure fuel to be injected as desired for a long period of time.

According to the invention, the method for manufacturing a multi-layer piezoelectric element of the invention includes the above-described steps. Thus, it is possible to reliably and stably manufacture the multi-layer piezoelectric element of the invention.

BRIEF DESCRIPTION OF DRAWINGS

FIG. 6(a) shows a cross-sectional view of a portion including a stress relaxing layer of another example in a cross-section perpendicular to the stacked direction of the stacked body of the multi-layer piezoelectric element shown in FIG. 1, and FIG. 6(b) shows a cross-sectional view of a portion including a stress relaxing layer of still another example thereof;

FIG. 7(a) shows a cross-sectional view of a portion including a stress relaxing layer of another example in a cross-section perpendicular to the stacked direction of the stacked body of the multi-layer piezoelectric element shown in FIG. 1, and FIG. 7(b) shows a cross-sectional view of a portion including a stress relaxing layer of still another example thereof;

FIGS. 10(a) to 10(d) respectively show plan views of an example of an outer lead member in the multi-layer piezoelectric element of the invention.

DESCRIPTION OF EMBODIMENTS

Hereinafter, examples of a multi-layer piezoelectric element according to an embodiment of the invention will be described in detail with reference to the drawings.

Figure 1:
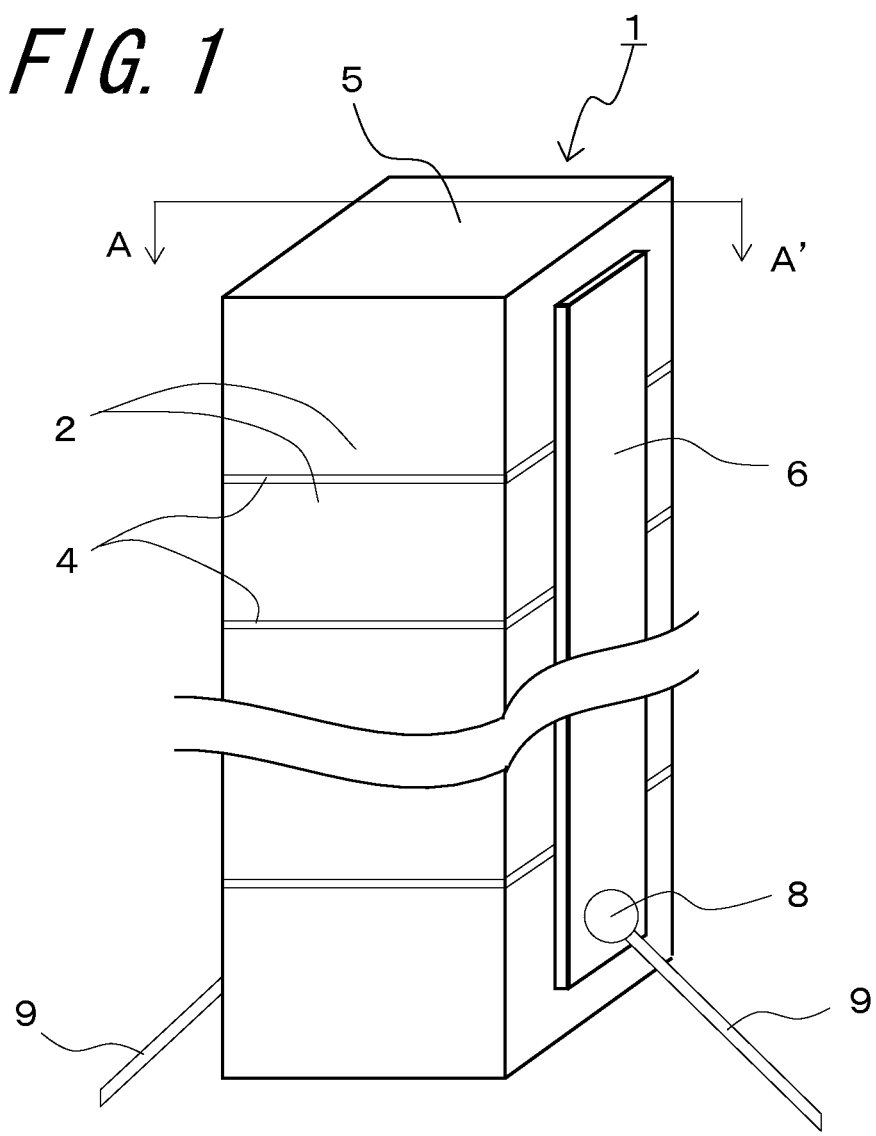
FIG. 1 is a perspective view showing an example of a multi-layer piezoelectric element according to an embodiment of the invention.
Figure 2:
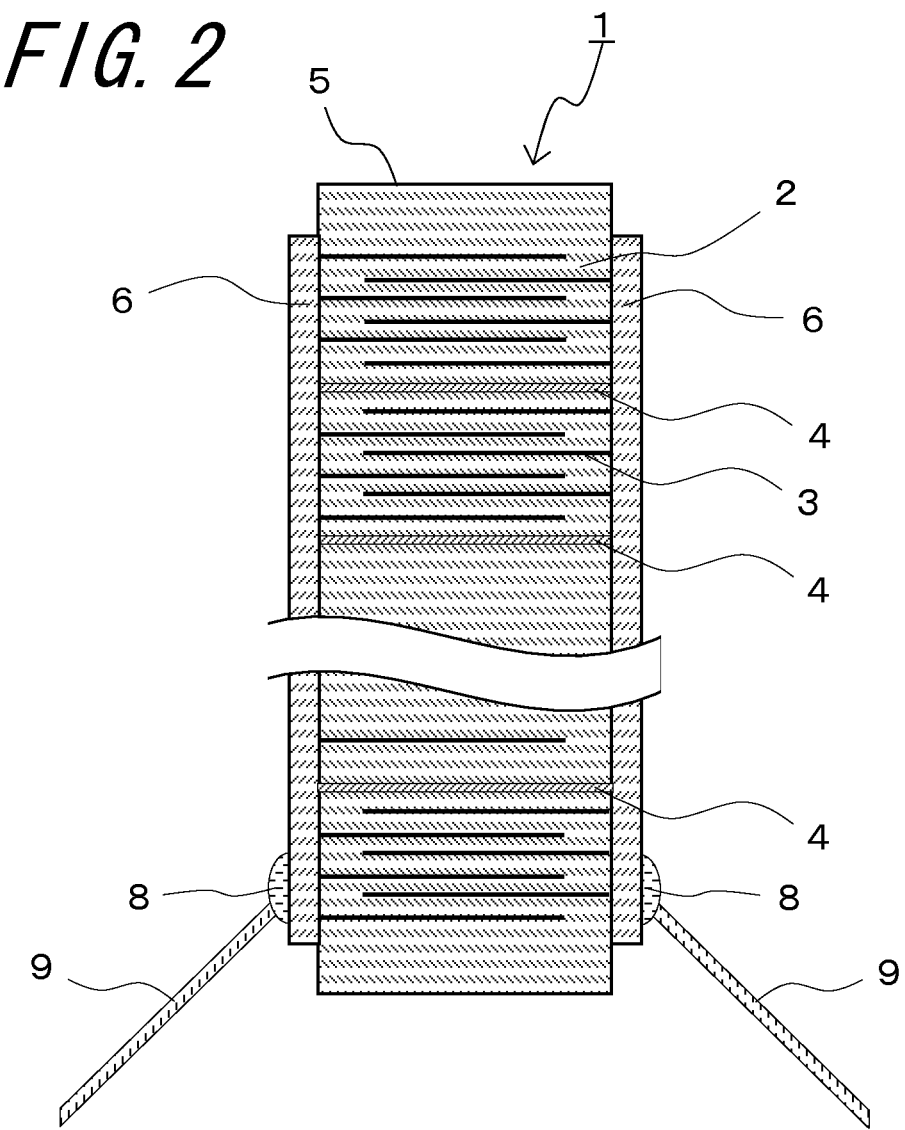
FIG. 2 is a cross-sectional view in an A-A' cross-section that is a cross-section parallel to a stacked direction of a stacked body of the multi-layer piezoelectric element shown in FIG. 1.
Figure 3:
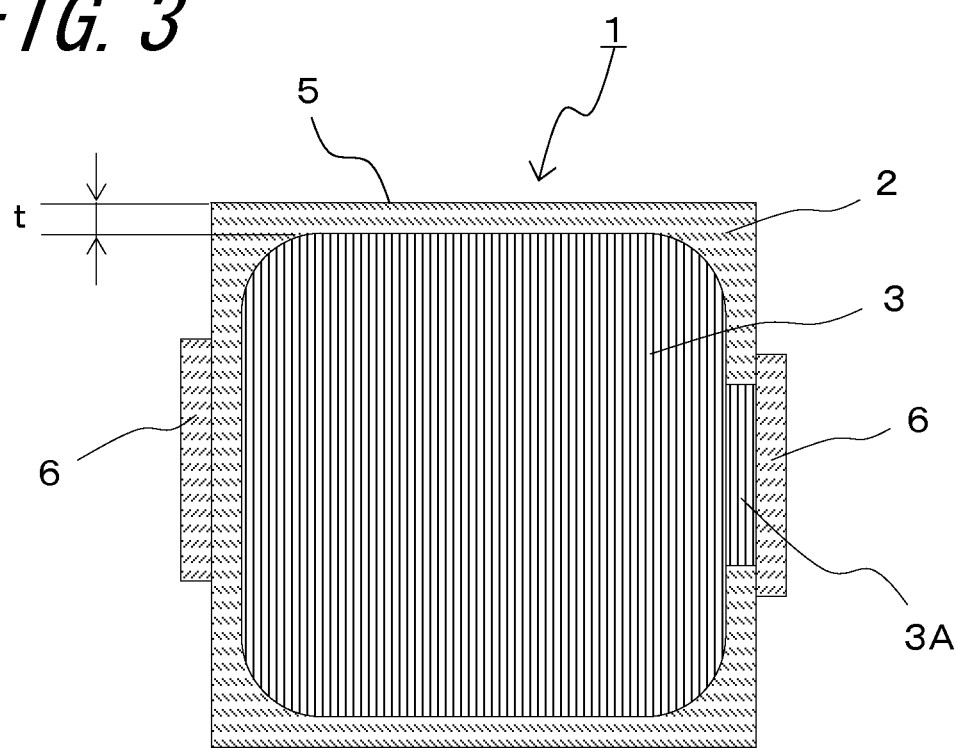
FIG. 3 is a cross-sectional view of a portion including an internal electrode in a cross-section perpendicular to the stacked direction of the stacked body of the multi-layer piezoelectric element shown in FIG. 1.
Figure 4:
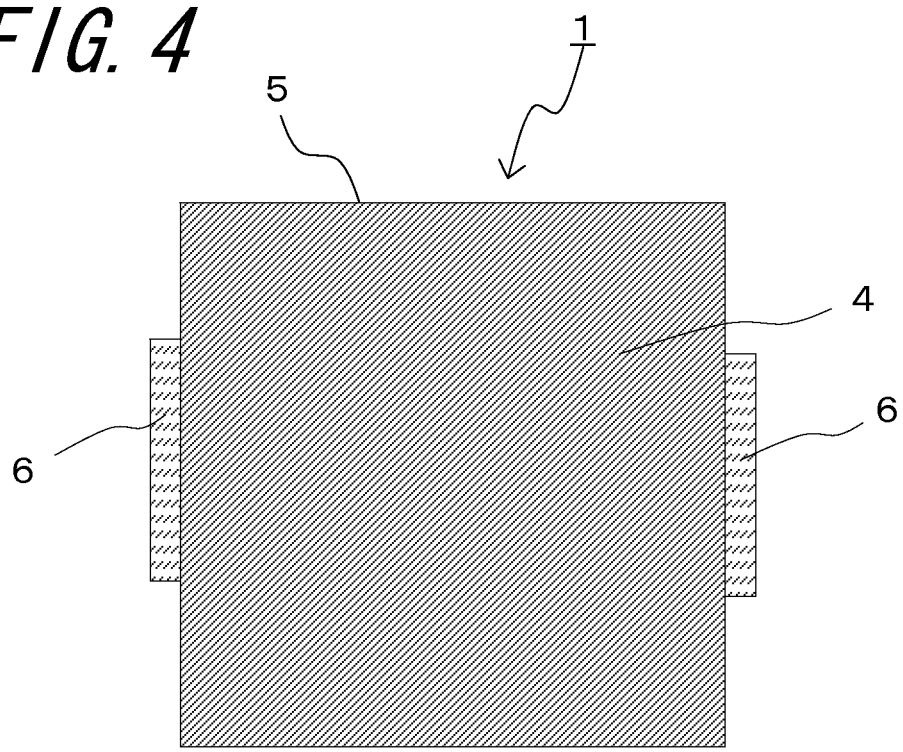
FIG. 4 is a cross-sectional view of a portion including a stress relaxing layer in a cross-section perpendicular to the stacked direction of the stacked body of the multi-layer piezoelectric element shown in FIG. 1.

FIG. 1 is a perspective view showing an example of a multi-layer piezoelectric element according to an embodiment of the invention, and FIG. 2 is a cross-sectional view in an A-A' cross-section that is a cross-section parallel to a stacked direction of a stacked body of the multi-layer piezoelectric element shown in FIG. 1. FIG. 3 is a cross-sectional view of a portion including an internal electrode in a cross-section perpendicular to the stacked direction of the stacked body of the multi-layer piezoelectric element shown in FIG. 1, and FIG. 4 is a cross-sectional view of a portion including a stress relaxing layer as in FIG. 3. As shown in FIGS. 1 to 4, a multi-layer piezoelectric element 1 of this example has a stacked body 5 in which piezoelectric layers 2 and internal electrode layers 3 are alternately laminated and a stress relaxing layer 4, that has a strength lower than that of the internal electrode layer 3 and is easily cracked by stress, is disposed at part of the portions between the piezoelectric layers 2, and external electrodes 6 configured to bond to side faces of the stacked body 5 so as to make electrical connection with the internal electrode layers 3. The internal electrode layers 3 are not exposed on side faces of the stacked body 5, but the stress relaxing layers 4 expose on the side faces of the stacked body 5.

The piezoelectric layers 2 forming the stacked body 5 are made of piezoelectric ceramics having piezoelectric properties, such as perovskite oxide containing $PbZrO_3$—$PbTiO_3$ or the like. Furthermore, the internal electrode layers 3 are laminated alternately with the piezoelectric layers 2, and sandwich each of the piezoelectric layers 2 from above and below. When a positive internal electrode layer 3 and a negative internal electrode layer 3 are laminated, a drive voltage is applied to the piezoelectric layer 2 sandwiched therebetween. The internal electrode layers 3 are made of, for example, metals such as silver-palladium (Ag—Pd), and, in this example, are arranged such that a positive electrode and a negative electrode (or a ground electrode) are electrically connected respectively via electrode extended portions 3A to a pair of external electrodes 6 configured to bond to opposing side faces of the stacked body 5. That is to say, the internal electrode layers 3 are not exposed on the side faces of the stacked body 5, and are linked via the electrode extended portions 3A to the side faces of the stacked body 5.

Furthermore, the portions between the piezoelectric layers 2 of the stacked body 5 partially have the stress relaxing layer 4 instead of the internal electrode layer 3. The stress relaxing layer 4 has a strength lower than that of the internal electrode layer 3 and is easily cracked by stress. Thus, stress generated in the stacked body 5 by driving operation causes damage such as cracks forming sooner in the stress relaxing layer 4 than in the internal electrode layer 3. That is to say, the stress relaxing layers 4 function as stress relaxing layers in the stacked body 5. In the multi-layer piezoelectric element of the invention, as in the multi-layer piezoelectric element 1 of this example as shown in FIGS. 1 to 4, the internal electrode layers 3 are not exposed on side faces of the stacked body 5, but the stress relaxing layers 4 expose on the side faces of the stacked body 5.

Since the stress relaxing layers 4 having a stress relaxing function expose on the side faces of the stacked body 5 in this manner, it is possible to selectively cause a crack initially in the stress relaxing layers 4 exposed on the side faces, the crack being supposed to occur in the stacked body 5 due to stress that is repeatedly generated by extension and contraction of the stacked body 5 when the multi-layer piezoelectric element 1 is used in, for example, a fuel injection device (injector) in an internal combustion engine of an automobile, that is, when used under severe conditions in which driving operation is continuously performed in a state where a high electric field and a high pressure are applied for a long period of time. Thus, it is possible to eliminate the risk that a crack extending between the internal electrode layers 3 will occur in the piezoelectric layer 2 to cause a short circuit between the positive internal electrode layer 3 and the negative internal electrode layer 3.

Furthermore, a crack that is selectively caused in the stress relaxing layers 4 in this manner reduces stress generated by extension and contraction of the stacked body 5, and, thus, displacement of the stacked body 5 is not restricted for a long period of time, and high displacement can be maintained for a long period of time.

Furthermore, according to the multi-layer piezoelectric element 1 of this example, the internal electrode layers 3 are not exposed on the side faces of the stacked body 5, and, thus, even when used at a high temperature such as in a fuel injection device (injector) in an internal combustion engine of an automobile, electric discharge does not occur between the internal electrode layers 3 on the side faces of the stacked body 5. Moreover, even when used in water or a chemical agent, electric discharge does not occur on the side faces of the stacked body 5.

Furthermore, generally, in the case of a multi-layer piezoelectric element in which internal electrode layers are not exposed on side faces of the stacked body, in order to prevent the internal electrode layers from being exposed on the side faces of the stacked body, outer edges of the internal electrode layers are retracted from the side faces of the stacked body in the inner direction of the stacked body (i.e., a portion on which no internal electrode layer is formed is provided around the internal electrode layer (between the internal electrode layer and an outer edge of the piezoelectric layer corresponding to a side face of the stacked body)). Thus, at that portion, a drive voltage is not applied to the piezoelectric layers, and extension and contraction of the stacked body does not occur, that is, that portion functions as a portion that restricts displacement of the stacked body. Furthermore, when the retracted distance of the internal electrode layer from the side faces of the stacked body is not uniform throughout the entire periphery in a direction perpendicular to the stacked direction of the stacked body (direction parallel to the piezoelectric layer and the internal electrode layer), the restricting force that restricts displacement of the stacked body acts as a large force on the side face having a larger retracted distance, and the restricting force acts as a small force on the side face having a smaller retracted distance, and, thus, the stacked body is not extended in the same direction as the stacked direction, which may result in the problem that the stacked body is extended at an angle with respect to the stacked direction. As the total length of the stacked body increases, it becomes more difficult to maintain the precision of the stacked body (i.e., the retracted distance varies more widely), so that this problem becomes more serious. Moreover, stress generated by the stacked body not being extended and contracted in the same direction as the stacked direction in this manner may cause a crack and damage the stacked body.

Meanwhile, in the multi-layer piezoelectric element 1 of this example, the internal electrode layers 3 are not exposed on the side faces of the stacked body 5, but the stress relaxing layers 4 expose on the side faces of the stacked body 5. Thus, even when the retracted distance of the internal electrode layers 3 is not uniform around the internal electrode layers 3 in a direction parallel to the internal electrode layers 3, a crack occurs in the stress relaxing layers 4 initially in the side face on which the restricting force that restricts displacement of the stacked body 5 acts as a large force because the retracted distance is large, that is, in the side face on which the retracted distance is large. Accordingly, a larger stress relaxing effect can be obtained on the side face having a larger restricting force. As a result, in the multi-layer piezoelectric element 1 of this example, since the stress relaxing layers 4 are provided, the stacked body 5 can be displaced in the same direction as to the stacked direction.

Thus, according to the multi-layer piezoelectric element 1 of this example, a crack does not extend inside the stacked body 5 even under a severe environment, and high durability and high reliability can be achieved for a long period of time.

In the multi-layer piezoelectric element 1 of this example, a retracted distance t from a side face of the stacked body 5 to an end portion of the internal electrode layer 3 that is not exposed on the side face of the stacked body 5 shown in FIG. 3 is preferably 5 μm or more and 500 μm or less in order to reliably prevent electric discharge on the side face of the stacked body 5 while securing driving operation with high displacement. When the retracted distance t is less than 5 μm, the insulating distance between internal electrode layers 3 that are closest to each other via the side face of the stacked body 5 is short in order to prevent electric discharge, and, thus, electric discharge may occur on the side face of the stacked body 5 or between the stacked body 5 and the outside thereof. On the other hand, when the retracted distance t is more than 500 μm, the area of a piezoelectrically inactive portion in which a drive voltage is not applied to the piezoelectric layers 2 inside the stacked body 5 increases, and, thus, electric discharge on the side face of the stacked body 5 or electric discharge between the stacked body 5 and the outside thereof does not occur, but the displacement amount decreases. Furthermore, since the area of the piezoelectrically inactive portion in the stacked body 5 increases, stress when the stacked body 5 is extended increases. Here, the length of the electrode extended portion 3A that electrically connects an end portion of the internal electrode layer 3 and the external electrode 6 is the same as the retracted distance t, and is preferably in the above-described range.

The stress relaxing layer 4 having a stress relaxing function in the stacked body 5 is formed as a layer that has a strength lower than that of the internal electrode layer 3 and is easily cracked by stress. Such stress relaxing layers 4 are made of, for example, insufficiently sintered piezoelectric layers, piezoelectric layers or metal layers having many voids, or layers in which piezoelectric particles or metal particles are distributed independently of each other. When the stacked body 5 is extended and tensile stress is applied in the stacked direction of the stacked body 5, a crack selectively occurs initially in the stress relaxing layers 4, and, thus, a crack is prevented from occurring in the internal electrode layers 3 and the piezoelectric layers 2.

Furthermore, the rigidity of the stress relaxing layer 4 is lower than that of the internal electrode layer 3, and thus lower than that of the piezoelectric layer 2. Accordingly, a crack that occurs in the stress relaxing layer 4 from the side face of the stacked body 5 does not extend so as to be curved toward the piezoelectric layer 2 or the internal electrode layer 3. Thus, a crack that occurs in the stress relaxing layer 4 extends along that stress relaxing layer 4, that is, the crack does not extend via the piezoelectric layers 2 sandwiching the stress relaxing layer 4 to the adjacent internal electrode layers 3, and a short circuit does not occur between the internal electrode layers 3.

Here, it is preferable that the adjacent internal electrode layers 3 positioned above and below the stress relaxing layer 4 have the same polarity (both internal electrode layers are positive or negative). The reason for this is to prevent an electric field from being formed between the adjacent internal electrode layers 3 positioned above and below the stress relaxing layer 4 (to prevent the piezoelectric layers 2 from being deformed).

In the multi-layer piezoelectric element of the invention, it is preferable that the stress relaxing layer 4 contains more voids than the internal electrode layer 3. When the stress relaxing layer 4 contains more voids than the internal electrode layer 3, the strength of the stress relaxing layer 4 is lower than the strength of the internal electrode layer 3. Thus, it is possible to selectively cause a crack stably initially in the stress relaxing layer 4.

When the stress relaxing layer 4 contains more voids than the internal electrode layer 3, it is preferable that the void fraction in the stress relaxing layer 4 (the ratio of the volume of voids occupied in the volume of the stress relaxing layer 4) is twice or more the void fraction in the internal electrode layer 3. When the void fraction in the stress relaxing layer 4 is twice or more the void fraction in the internal electrode layer 3, the strength of the stress relaxing layer 4 can be made reliably lower than the strength of the internal electrode layer 3. Thus, when stress is generated inside the stacked body 5 according to the extension and contraction, it is possible to cause a crack in the stress relaxing layers 4 before a crack occurs in the internal electrode layers 3, and, thus, stress generated inside the stacked body 5 can be relaxed.

The voids in the stress relaxing layers 4 are usually in the shape of circles or a plurality of linked circles. In order to effectively reduce the strength of the stress relaxing layers 4 so as to selectively cause a crack, it is preferable that the voids in the stress relaxing layers 4 are in the shape of a plurality of voids that are linked to each other.

Furthermore, in the multi-layer piezoelectric element of the invention, it is preferable that the stress relaxing layer 4 includes metal portions that are independent of each other. When the metal portions softer than a piezoelectric material which forming the piezoelectric layer 2 are distributed so as to be independent of each other, the rigidity of the stress relaxing layer 4 can be reduced, and the stress relaxing layer 4 can function well as a stress relaxing layer in the stacked body 5, and can prevent a crack from extending inside the stacked body 5. These metal portions are distributed so as to be independent of each other in a so-called island-form in the stress relaxing layer 4. Furthermore, these metal portions may be arranged together with the voids. In this case, the effect from both can be synergistically obtained. Here, the metal portions are independent of each other in the stress relaxing layer 4, and, thus, there is no electrical conduction between the metal portions.

Furthermore, it is preferable that the metal portions that are independent of each other contained in the stress relaxing layer 4 are partially bonded to the adjacent piezoelectric layers 2. In this case, the area in which the metal portions and the piezoelectric layers 2 are bonded to each other can be reduced, and, thus, the strength of the stress relaxing layer 4 can be further reduced, and the stress relaxing layer 4 can function more effectively as a stress relaxing layer in the stacked body 5.

Furthermore, in the multi-layer piezoelectric element of the invention, it is preferable that a plurality of stress relaxing layers 4 are arranged at predetermined intervals in the stacked direction of the stacked body 5. In this case, in other words, when a plurality of stress relaxing layers 4 are periodically arranged, stress can be relaxed throughout the entire stacked body 5 substantially uniformly in the stacked direction of the stacked body 5, and, thus, a crack can be effectively prevented from occurring in a large number of internal electrode layers 3 formed throughout the entire stacked body 5 or inside the stacked body 5.

In the case of arranging a plurality of stress relaxing layers 4, the stress relaxing layers 4 may be arranged at intervals corresponding to every ½ or less the number of a plurality of internal electrode layers 3, preferably every ⅛ or less the number of internal electrode layers 3, and more preferably still, every 1/15 or less the total number of layers. Here, when the stress relaxing layers 4 are arranged at an interval of more than ½ the total number of internal electrode layers 3, the number of stress relaxing layers 4 in the stacked body 5 becomes small, and, thus, it is difficult to relax stress well throughout the stacked direction of the stacked body 5. Here, portions near both end portions of the stacked body 5 in the stacked direction are inactive portions in which the piezoelectric layers 2 are not sandwiched by the internal electrode layers 3, that is, the piezoelectric layers 2 are not extended or contracted and stress is not generated therein, and, thus, the rule of arrangement of the stress relaxing layers 4 near the center of the stacked body 5 may not be applied.

Here, the stress relaxing layers 4 being arranged in the stacked body 5 "at predetermined intervals" refers to, as a matter of course, the case in which the intervals between the stress relaxing layers 4 are uniform, and also to the case in which the intervals are similar to each other so that stress can be relaxed substantially uniformly throughout the entire stacked body 5 in the stacked direction even when the intervals vary. More specifically, the intervals between the stress relaxing layers 4 may be within the range of ±20%, preferably within the range of ±15%, of an average value.

Figure 5:
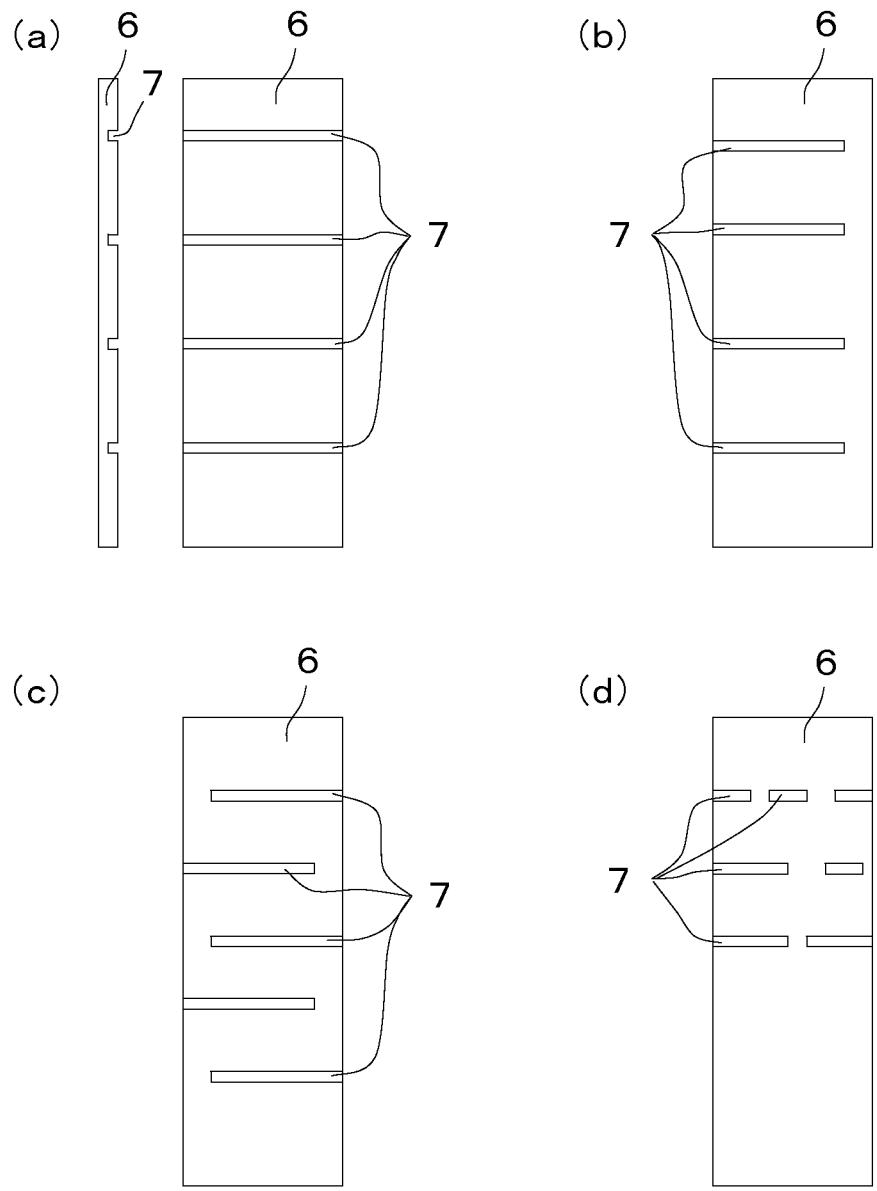
FIG. 5(a) shows a side view and a plan view of an example in which slits are formed in an external electrode in the multi-layer piezoelectric element shown in FIG. 1, and FIGS. 5(b) to 5(d) show plan views thereof.

Furthermore, in the multi-layer piezoelectric element of the invention, it is preferable that the external electrode 6 has slits 7 which are formed in portions of the external electrode 6 corresponding to the locations of the stress relaxing layers 4 between the piezoelectric layers 2 as shown in the side view and the plan view in FIG. 5(*a*) and the plan views in FIGS. 5(*b*) to 5(*d*) showing other examples of the external electrode 6 in the multi-layer piezoelectric element 1. In this case, since the slits 7 are formed in the external electrode 6, stress repeatedly generated by extension and contraction of the stacked body 5 and applied to the external electrode 6 can be distributed by the slits 7 in the external electrode 6, and, thus, the external electrode 6 can be effectively prevented from being detached from the side face of the stacked body 5 due to driving operation for a long period of time.

For example, when the external electrode 6 is formed by printing and baking a conductive paste on a side face of the stacked body 5, the slits 7 formed on the external electrode 6 can be formed by, after printing and baking the conductive paste for forming the external electrode 6, forming notches in portions corresponding to the stress relaxing layers 4 using a dicing apparatus or the like. Furthermore, when the external electrode 6 is made of a metal plate, the slits 7 can be formed by forming notches in portions corresponding to the stress relaxing layers 4, and the external electrode 6 may be bonded to the side face of the stacked body 5 in a state where the slits 7 on the metal plate are adjusted to the positions of the stress relaxing layers 4. Here, in FIG. 5, the stacked body 5 and the internal electrode layers 3 are not shown.

It is preferable that the slits 7 formed on the external electrode 6 are formed throughout the entire external electrode 6 in the width direction (direction perpendicular to the stacked direction of the stacked body 5, that is, direction along the internal electrode layers 3) in such a manner that the external electrode 6 is not separated into an upper portion and a lower portion continuously throughout the entire width of the external electrode 6. In this case, as specifically shown in the side view and the plan view in FIG. 5(*a*) showing another example of the external electrode 6 in the multi-layer piezoelectric element 1, it is preferable that the slits 7 are formed throughout the width direction of the external electrode 6 but do not penetrate the external electrode 6 in the thickness direction. Furthermore, as other configurations, the slits 7 may be formed on either the right or left side of the external electrode 6 in a so-called comb-form as shown in the plan view in FIG. 5(*b*), may be formed alternately from right and left sides as shown in FIG. 5(*c*), or may be formed such that a plurality of short slits 7 are arranged along the corresponding internal electrode layers 3 as shown in FIG. 5(*d*).

Furthermore, it is preferable that the width of the slits 7 is 30 μm or less according to the thickness of the corresponding internal electrode layers 3 in order to prevent the strength of the external electrode 6 from being significantly lowered or the resistance from being increased. Furthermore, when the external electrode 6 is not separated by the slits 7 as in the examples shown in FIGS. 5(*b*) to 5(*d*), it is preferable that the slits 7 have a depth at which the slits 7 penetrate the external electrode 6 throughout the entire thickness of the external electrode 6 in order to relax stress, but, even when the depth does not reach the entire thickness, it is preferable that the depth reaches at least half the thickness thereof.

In the multi-layer piezoelectric element of the invention, it is preferable that a non-formed region where the stress relaxing layer 4 is not formed exists between the piezoelectric layers 2. That is to say, as shown in the cross-sectional views in FIGS. 6(*a*) and 6(*b*) showing a portion including the stress relaxing layer 4 as in FIG. 4, a non-formed region 4A in the shape of a circle is disposed in the center of the stress relaxing layer 4 in the example shown in FIG. 6(*a*), and a non-formed region 4A in the shape of an ellipse having a major axis that is orthogonal to a line between the external electrodes 6 is disposed in the center of the stress relaxing layer 4 in the example shown in FIG. 6(*b*). Since the non-formed region 4A where the stress relaxing layer 4 is not formed exists between the piezoelectric layers 2 in this manner, the upper and the lower piezoelectric layers 2 can be bonded to each other at the non-formed region 4A, and, thus, when driving the stacked body 5, a developed force generated by extension and contraction of the stacked body 5 can be reliably transmitted in the stacked direction of the stacked body 5 without passing through the stress relaxing layer 4 having a low strength. Furthermore, even when a crack occurs and extends in the stress relaxing layer 4 as the multi-layer piezoelectric element 1 is driven, the upper and the lower piezoelectric layers 2 can be kept bonded to each other via the non-formed region 4A included in the stress relaxing layer 4, and, thus, the upper and the lower piezoelectric layers 2 are not completely separated from each other, and the stacked body 5 can be prevented from being divided into pieces at the stress relaxing layer 4.

The shape of the non-formed region 4A provided in the stress relaxing layer 4 is not be limited to a circle or an ellipse as shown in FIG. 6, and may be other various shapes such as a rectangle. Furthermore, the number of non-formed regions 4A is not limited to one at the center as shown in FIG. 6, and may be plural. Here, it is preferable that the position of the non-formed region 4A is set so as to avoid the peripheral portion because a crack that is supposed to occur in the stress relaxing layer 4 basically originates from the periphery in which the stress relaxing layer 4 exposes on the side face of the stacked body 5.

Furthermore, in the multi-layer piezoelectric element of the invention, when the stress relaxing layer 4 has the non-formed region 4A, it is preferable that the stress relaxing layer 4 is divided by the non-formed region 4A between the piezoelectric layers 2 as shown in the cross-sectional views in FIGS. 7(*a*) and 7(*b*) showing a portion including the stress relaxing layer 4 as in FIGS. 6(*a*) and 6(*b*). Moreover, when the stress relaxing layer 4 is divided by the non-formed region 4A, it is preferable that the stress relaxing layer 4 is divided by the non-formed region 4A between the positive and the negative external electrodes 6. When the stress relaxing layer 4 is divided by the non-formed region 4A, a region can be formed in which the upper and the lower piezoelectric layers 2 are bonded to each other according to that non-formed region 4A over opposing side faces or adjacent side faces of the stacked body 5, and, thus, the above-described effect can be more reliably obtained. That is to say, the stacked body 5 can be prevented from being divided by internal stress into pieces at the stress relaxing layer 4, and a developed force can be reliably transmitted when driving the multi-layer piezoelectric element. Furthermore, when the stress relaxing layer 4 is divided by the non-formed region 4A between the positive and the negative external electrodes 6, even in the case where the multi-layer piezoelectric element 1 is used in a liquid, a short circuit can be reliably prevented from occurring between the positive external electrode 6 and the negative external electrode 6.

Figure 8:
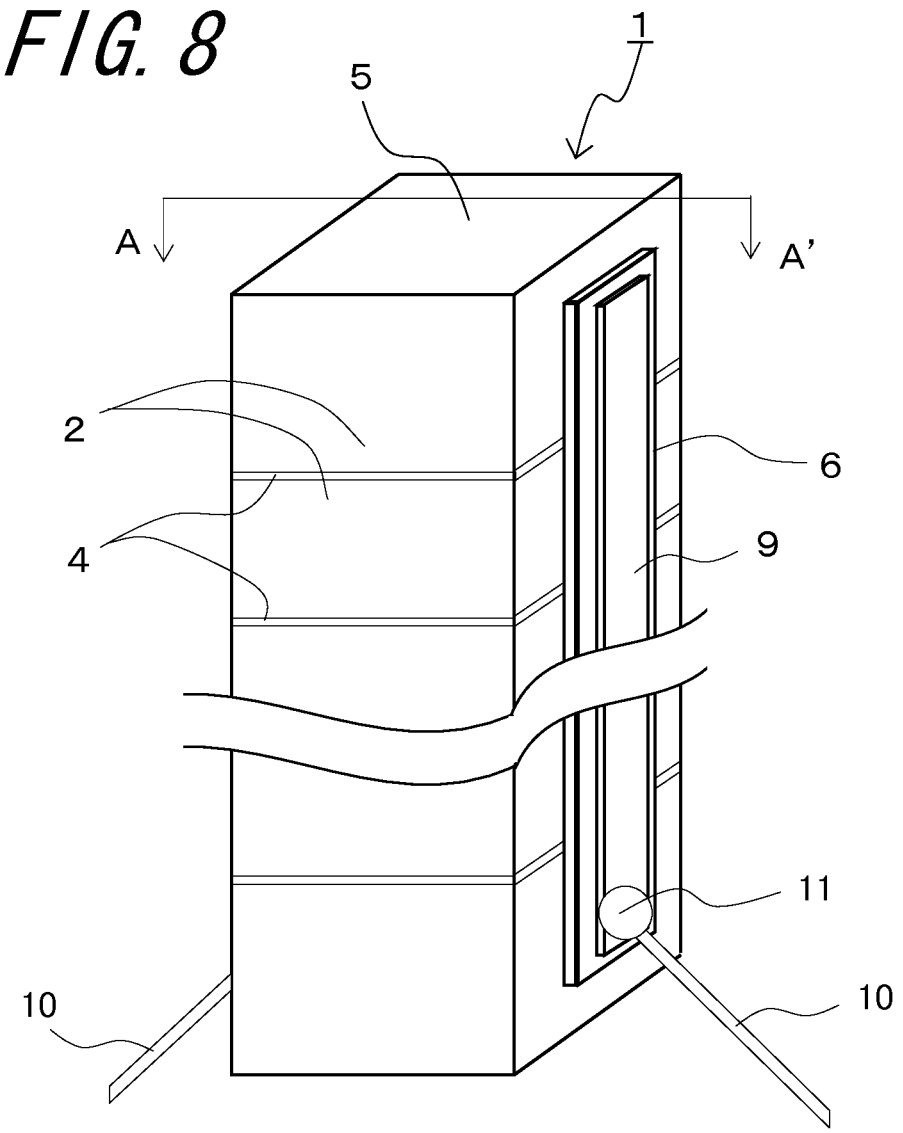
FIG. 8 is a perspective view showing another example of the embodiment of the multi-layer piezoelectric element according to the invention.
Figure 9:
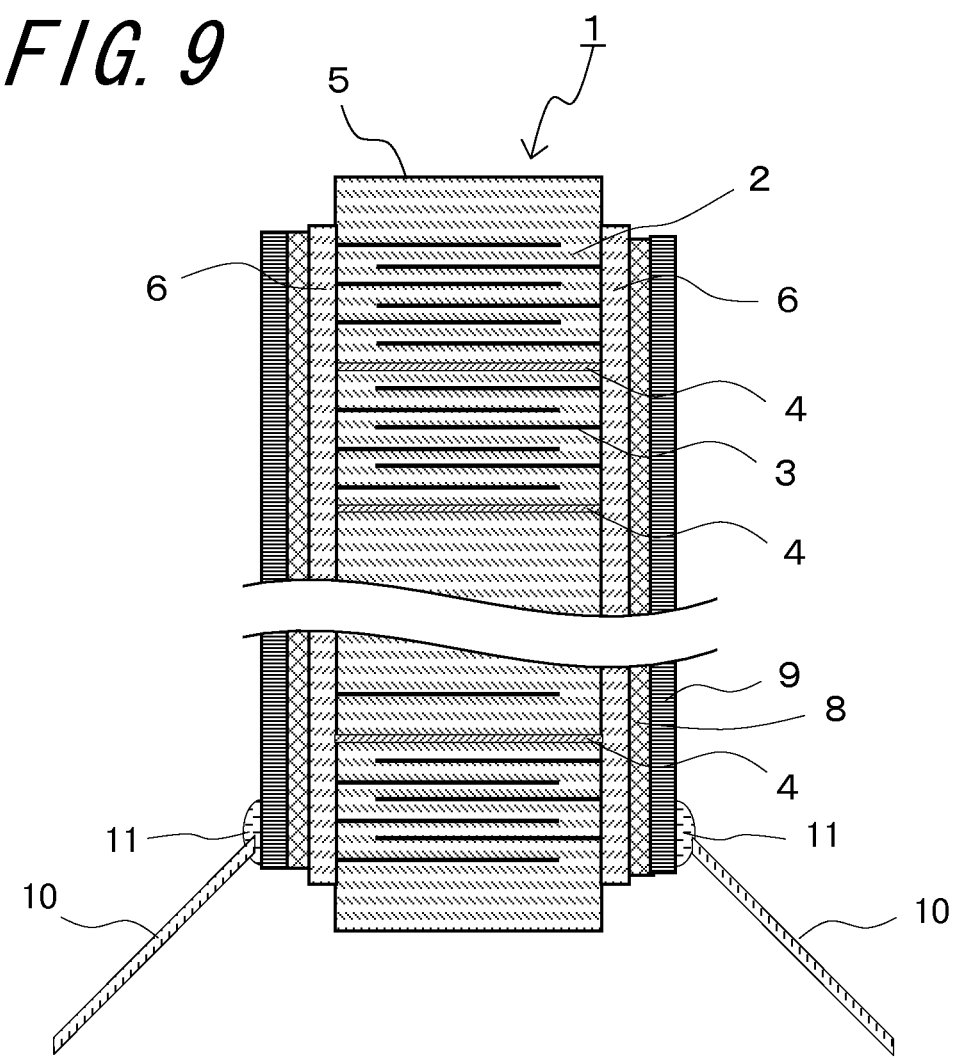
FIG. 9 is a cross-sectional view in an A-A' cross-section that is a cross-section parallel to the stacked direction of the stacked body of the multi-layer piezoelectric element shown in FIG. 8.

Regarding the multi-layer piezoelectric element of the invention, another example of the embodiment is shown in FIG. 8 in a perspective view as in FIG. 1 and in FIG. 9 in a cross-sectional view in the A-A' cross-section as in FIG. 2. As shown in these drawings, it is preferable that outer lead members 9 are bonded via conductive bonding members 8 to the surfaces of the external electrodes 6. With this configuration, even when a large current is caused to flow through the external electrodes 6 to drive the multi-layer piezoelectric element 1 at a high speed, supply of the current to the external electrodes can be distributed so as to cause a large current to flow through the conductive bonding members 8 and the outer lead members 9, and, thus, local heat generation at the external electrodes 6 can be suppressed. Furthermore, as described later, the outer lead members 9 have a flexible structure with respect to the extension and contraction direction of the stacked body 5, and, thus, even when the slits 7 are arranged on the external electrodes 6, the outer lead members 9 can supply a current to each portion of the external electrodes 6 separated along the slits 7. Thus, there is no risk of electrical power not being supplied to part of the piezoelectric layers 2. Furthermore, the outer lead members 9 can follow the movement of the external electrodes 6, and, thus, even when slits are arranged on the external electrodes 6, wires of the external electrodes 6 are not broken. Here, in the example shown in FIGS. 8 and 9, reference numeral 10 denotes a lead wire, and reference numeral 11 denotes a lead wire connecting member. The lead wires 10 are connected via the lead wire connecting members 11 to the outer lead members 9. The lead wires 10 and the lead wire connecting members 11 are used instead of the outer lead members 9 and the conductive bonding members 8 in the example shown in FIGS. 1 and 2.

The conductive bonding members 8 are made of a conductive resin, a solder, or the like. Of these materials, a conductive resin is preferable because of the flexibility that allows the conductive bonding members 8 to follow deformation of the external electrodes 6 well, according to displacement of the stacked body 5. Such a conductive resin preferably contains, as a conductive material, a metal such as silver (Ag), gold (Au), nickel (Ni), or copper (Cu), or an alloy thereof. In particular, a silver powder is preferably used, which is excellent in oxidation resistance, has a low resistance, and is relatively inexpensive. The conductive material in the conductive bonding members 8 made of a conductive resin is used in the form of a powder, and it is preferable that the particle shape thereof is non-spherical such as needles or flakes, in order to reduce resistance and increase strength. Furthermore, as a resin that forms the conductive resin, silicone, epoxy, polyimide, polyamide, or the like may be used. Here, considering use at a high temperature, polyimide is preferably used.

It is preferable that the outer lead members 9 are wire members as in the example shown in FIGS. 1 and 2, or have a shape that allows the outer lead members 9 to follow extension and contraction of the stacked body 5, for example, as shown in the plan views in FIGS. 10(a) to 10(d). That is to say, the outer lead members 9 may be in the shape of wire members arranged side by side in a direction perpendicular to the stacked direction of the stacked body 5 as shown in FIG. 10(a), may be in the shape of a mesh made of metal as shown in FIG. 10(b), may be in the shape of a metal plate provided with slits so as to follow extension and contraction of the stacked body 5 as shown in FIG. 10(c), or may be in the shape of a metal plate provided with through holes so as to follow extension and contraction of the stacked body 5 as shown in FIG. 10(d). FIGS. 8 and 9 show an example using such outer lead members 9.

The outer lead members 9 are connected and fixed via the conductive bonding members 8 to the external electrodes 6. Here, it is preferable that part of the outer lead members 9 is embedded in the conductive bonding members 8. The reason for this is to increase the strength in attaching the outer lead members 9 to the external electrodes 6.

Next, a method for manufacturing the multi-layer piezoelectric element 1 of this example will be described.

First, piezoelectric ceramic green sheets for forming the piezoelectric layers 2 are formed. More specifically, a calcined powder of piezoelectric ceramics, a binder made of an organic polymer such as acrylic-based polymer or butyral-based polymer, and a plasticizer are mixed to form a ceramic slurry. Then, the ceramic slurry is formed into piezoelectric ceramic green sheets using a tape casting method such as the doctor blade method or the calendar roll method. Any piezoelectric ceramics may be used as long as the piezoelectric properties can be exhibited, and examples thereof include perovskite oxide made of lead zirconate titanate (PZT: $PbZrO_3$—$PbTiO_3$) and the like. Furthermore, dibutyl phthalate (DBP), dioctyl phthalate (DOP), or the like may be used as the plasticizer.

Next, an internal electrode layer conductive paste for forming the internal electrode layers 3 is formed. More specifically, a binder and a plasticizer are added to and mixed with a metal powder of silver-palladium alloy to form an internal electrode layer conductive paste. This internal electrode layer conductive paste is used not only for forming the internal electrode layers 3 but also for forming the electrode extended portions 3A. Here, a mixture of a silver powder and a palladium powder may be used instead of the silver-palladium alloy.

Next, a stress relaxing layer paste for forming the stress relaxing layers 4 is formed. More specifically, for example, a binder and a plasticizer are added to and mixed with a metal powder formed so as to have a higher silver ratio than that of the internal electrode layer conductive paste to form a stress relaxing layer paste. At that time, a mixture of a silver powder and a palladium powder, a silver-palladium alloy powder, or a mixture of the internal electrode layer conductive paste and a silver powder may be used. Furthermore, the stress relaxing layer 4 is a layer that has a strength lower than that of the internal electrode layer 3 and is easily cracked by stress, and, thus, this layer may be a layer having a large number of voids, a layer in which particles are relatively loosely linked to each other, or a layer made of a so-called brittle material. In this case, various pastes such as a paste containing acrylic beads or the like as described later may be used as the stress relaxing layer paste.

Next, the internal electrode layer conductive paste is applied onto the piezoelectric ceramic green sheets in the pattern of the internal electrode layer 3, for example, using screen printing. Here, the internal electrode layer conductive paste is applied in the pattern of the internal electrode layer 3, and, at the same time, this internal electrode layer conductive paste is also applied in the pattern of the electrode extended portion 3A.

Moreover, the stress relaxing layer paste is applied onto other piezoelectric ceramic green sheets in the pattern of the stress relaxing layer 4 using screen printing. The pattern of the stress relaxing layer 4 may be arranged across the entire face of a cross-section perpendicular to the stacked direction of the stacked body 5, or a non-formed portion (portion on which the stress relaxing layer paste is not printed) for forming the non-formed region 4A may be partially formed inside the pattern. It is preferable to form a non-formed portion. Moreover, the pattern divided by the non-formed region 4A between the positive and the negative external electrodes 6 is preferably used for production.

Next, a predetermined number of piezoelectric ceramic green sheets to which the internal electrode layer conductive paste has been applied are laminated. At that time, the piezoelectric ceramic green sheet to which the stress relaxing layer paste has been applied is laminated at predetermined intervals (every predetermined number of piezoelectric ceramic green sheets).

Furthermore, after debinding treatment at a predetermined temperature, firing is performed at 900° C. to 1200° C. to form a stacked body 5 in which piezoelectric layers 2 and internal electrode layers 3 are alternately laminated and a stress relaxing layer 4 is disposed at part of the portions between the piezoelectric layers 2.

In this firing process, there is a concentration gradient of silver between the stress relaxing layer paste and the internal electrode layer conductive paste, and, thus, the silver component in the stress relaxing layer paste is diffused via the piezoelectric ceramic green sheet into the internal electrode layer conductive paste. Accordingly, in the stress relaxing layer 4 after the firing, the metal component remains as metal portions that are independent of each other and distributed in the form of islands. Thus, the stress relaxing layer 4 is less rigid than the internal electrode layer 3. Furthermore, such a stress relaxing layer 4 includes many voids.

Furthermore, in the stress relaxing layer paste corresponding to a portion that is positioned across the piezoelectric ceramic green sheet from the stress relaxing layer paste but to which the internal electrode layer conductive paste has not been applied, the amount of silver diffused decreases due to the concentration gradient of silver, and, thus, as described later, it is preferable that a second conductive paste for forming a dummy internal electrode layer after firing is applied in advance to that portion to be removed by shaping processing after the firing.

That is to say, the internal electrode layer conductive paste, as a first conductive paste for forming the internal electrode layer 3 and the electrode extended portion 3A after firing, is applied by screen printing, in the patterns of the internal electrode layer 3 and the electrode extended portion 3A, onto a first piezoelectric ceramic green sheet, and a second conductive paste for forming a dummy internal electrode layer after sintering is applied by screen printing onto the same first piezoelectric ceramic green sheet so as to surround the internal electrode layer conductive paste (the first conductive paste) at a predetermined interval from the internal electrode layer conductive paste (the first conductive paste).

Here, when the internal electrode layer conductive paste (the first conductive paste) is printed onto the first piezoelectric ceramic green sheet in the pattern of a plurality of the internal electrode layers 3 and a plurality of electrode extended portions 3A so as to form a plurality of multi-layer piezoelectric elements after firing and dividing, the second conductive paste may be printed between the portions in the pattern of the internal electrode layer conductive paste (the first conductive paste) at a predetermined interval from the respective portions of the pattern of the internal electrode layer conductive paste.

Subsequently, as described above, a predetermined number of first piezoelectric ceramic green sheets onto which the internal electrode layer conductive paste (the first conductive paste) and the second conductive paste have been applied are laminated. At that time, a second piezoelectric ceramic green sheet onto which a third conductive paste as a stress relaxing layer paste has been applied is laminated at predetermined intervals (every predetermined number of piezoelectric ceramic green sheets).

Furthermore, after debinding treatment at a predetermined temperature, firing is performed at 900° C. to 1200° C. to form a stacked body 5 in which piezoelectric layers 2 and internal electrode layers 3 are alternately laminated, the internal electrode layers 3 being each surrounded by a dummy internal electrode layer, and a stress relaxing layer 4 is disposed at part of the portions between the piezoelectric layers 2.

In this case, in the stress relaxing layer paste (the third conductive paste) corresponding to a portion that is positioned across the first or the second piezoelectric ceramic green sheet from the stress relaxing layer paste but to which the internal electrode layer conductive paste (the first conductive paste) has not been applied, diffusion of silver is facilitated also by a concentration gradient with respect to the second conductive paste that has been applied side by side at a predetermined interval from the internal electrode layer conductive paste (the first conductive paste). Accordingly, in the stress relaxing layer 4 after the firing, the metal component remains as metal portions that are independent of each other and distributed in the form of islands. Thus, a stress relaxing layer 4 can be formed that is less rigid and has more voids than the internal electrode layer 3. Here, as the second conductive paste, it is possible to use a paste that is the same as the internal electrode layer conductive paste (the first conductive paste), or that is made of silver-palladium having a silver ratio lower than that of the internal electrode layer conductive paste (the first conductive paste) (in either case, having a silver ratio lower than that of the stress relaxing layer paste (the third conductive paste)). It is preferable to apply a paste that is the same as the internal electrode layer conductive paste (the first conductive paste) simultaneously in the pattern of the internal electrode layer and in the pattern of the dummy internal electrode layer at a predetermined interval, in view of the precision of paste patterns and the productivity of paste application.

Here, formation of the stress relaxing layers 4 is not limited to the above-described production method. For example, as the stress relaxing layer paste, a mixture of a substance that disappears through dissipation during firing (e.g., acrylic beads), a silver-palladium powder, a binder and a plasticizer; or a mixture of a substance that disappears through dissipation during firing (e.g., acrylic beads), a calcined powder of piezoelectric ceramics, a binder and a plasticizer may be used.

The acrylic beads disappear through dissipation during firing and voids are formed in the place thereof, and, thus, it is possible to form a stress relaxing layer 4 having many voids. The amount of voids in the stress relaxing layer 4 can be adjusted with the amount of acrylic beads contained in the stress relaxing layer paste.

Next, grinding processing treatment is performed using a surface grinder or the like on the stacked body 5 obtained by firing such that the side faces thereof have a predetermined shape. The portion in which the dummy internal electrode layer has been formed with the application of the second conductive paste is removed together with the periphery portion of the piezoelectric layer 2 during this shaping processing (grinding processing on the side faces). Accordingly, it is possible to form a stacked body 5 in which piezoelectric layers 2 and internal electrode layers 3 are alternately laminated and a stress relaxing layer 4 is disposed at part of the portions between the piezoelectric layers 2.

Subsequently, a silver-glass conductive paste containing silver as a main component and also containing glass is printed in the pattern of the external electrodes 6 on side faces of the stacked body 5 to which the electrode extended portions 3A electrically connected to the internal electrode layers 3 are extended, and firing is performed at 650° C. to 750° C., to form the external electrodes 6.

Subsequently, as necessary, the slits 7 are formed using a dicing apparatus or the like in the external electrodes 6 in portions corresponding to the stress relaxing layers 4.

Next, the outer lead members 9 are connected and fixed to the surfaces of the external electrodes 6 via the conductive bonding members (solder) 8. Here, in the case of the multi-layer piezoelectric element 1 used for an application in which a large current is caused to flow to perform driving operation at a high speed, after the slits 7 are formed in the external electrodes 6, the outer lead members 9 are connected and fixed at the conductive bonding members 8.

Subsequently, a direct electric field of 0.1 to 3 kV/mm is applied from the outer lead members 9 respectively connected to the pair of external electrodes 6, and, thus, the piezoelectric layers 2 forming the stacked body 5 are polarized, to complete the multi-layer piezoelectric element 1. With this multi-layer piezoelectric element 1, the external electrodes 6 are connected via the outer lead members 9 to an external power source, and a drive voltage is applied to the piezoelectric layers 2, and, thus, each of the piezoelectric layers 2 can be greatly displaced due to the piezoelectric converse effect. Accordingly, the multi-layer piezoelectric element 1 can function, for example, as an automobile fuel injection valve that injects and supplies fuel to an engine.

Figure 11:
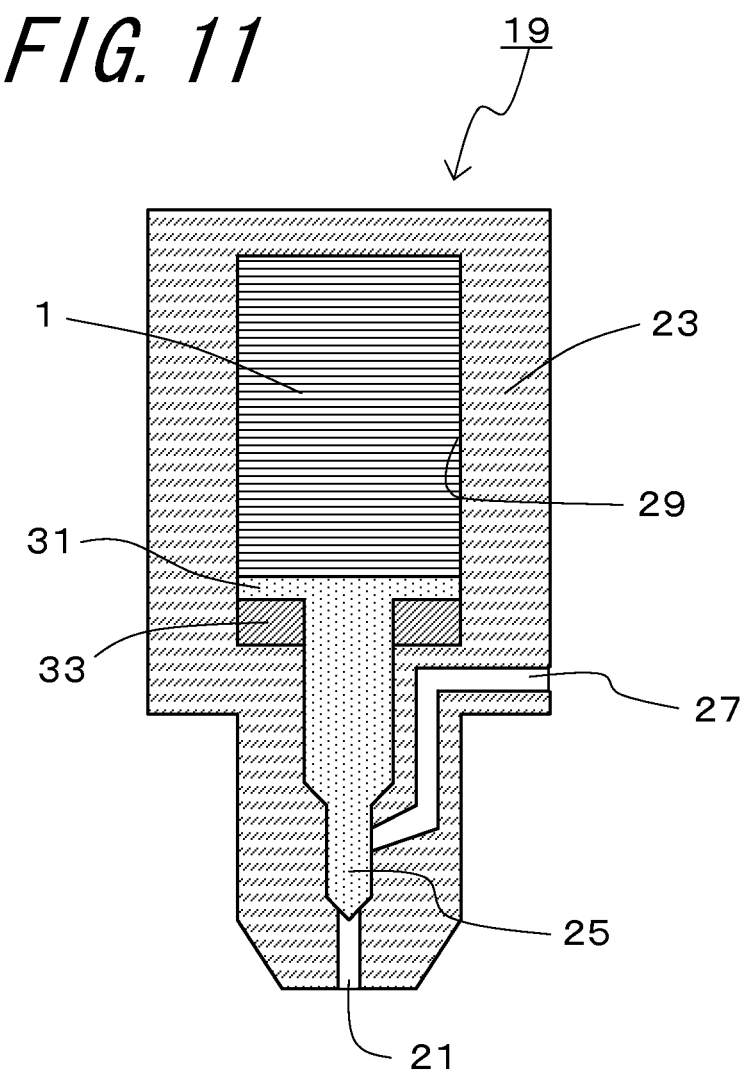
FIG. 11 is a schematic cross-sectional view showing an example of an injection device according to an embodiment of the invention.

Next, an example of an injection device according to an embodiment of the invention will be described. FIG. 11 is a schematic cross-sectional view showing an example of an injection device according to an embodiment of the invention.

As shown in FIG. 11, an injection device 19 of this example comprises a housing (container) 23 comprising an injection hole 21 at one end thereof, and the foregoing multi-layer piezoelectric element 1 of the example placed within inside the housing 23.

In an interior of the housing 23 is disposed a needle valve 25 capable of opening and closing of the injection hole 21. A fluid passage 27 is so disposed as to be capable of communicating with the injection hole 21 in accordance with the movement of the needle valve 25. The fluid passage 27 is coupled to an external fluid supply source, so that a fluid is supplied to the fluid passage 27 under high pressure at all times. Therefore, when the needle valve 25 is operated to open the injection hole 21, then a fluid which has been fed through the fluid passage 27 is injected, through the injection hole 21, to an exterior of the device or into an adjacent container, for example, a fuel chamber of an internal-combustion engine (not shown).

Furthermore, an upper end of the needle valve 25 is a piston 31 having an inner diameter larger than that of the other portions, and this piston 31 slides along the inner wall of the cylindrical housing 23. Furthermore, the foregoing multi-layer piezoelectric element 1 of the invention is placed within the housing 23.

In the injection device 19, upon extension of the multi-layer piezoelectric element 1 entailed by application of voltage, the piston 31 is pushed forward, thus causing the needle valve 25 to close the fluid passage 27 communicating with the injection hole 21 with a consequent halt on supply of fluid. Moreover, upon stopping the application of voltage, the multi-layer piezoelectric element 1 is contracted, and a disc spring 33 pushes the piston 31 backward, thereby opening the fluid passage 27. In consequence, the injection hole 21 communicates with the fluid passage 27 so that injection of fluid can be carried out through the injection hole 21.

It is noted that the injection device may be so designed that the fluid passage 27 is opened by applying a voltage to the multi-layer piezoelectric element 1, and is contrariwise closed upon a halt on the application of voltage.

Moreover, the injection device of the example may comprise a housing comprising an injection hole and the multi-layer piezoelectric element 1 according to the embodiment, wherein a fluid stored in the housing is configured to be injected through the injection hole by driving operation of the multi-layer piezoelectric element 1. That is, the multi-layer piezoelectric element 1 does not necessarily have to be placed within the housing 23. It is essential only that a pressure for control of fluid injection is applied to the interior of the housing by driving operation of the multi-layer piezoelectric element 1. In the injection device 19 of this example, the term "fluid" is construed as encompassing not only fuel and ink, but also various liquid fluid such as a conductive paste, and gases. The use of the injection device 19 of the example makes it possible to control a flow rate of fluid and timing of fluid injection with stability for a long period of time.

When the injection device 19 of this example using the multi-layer piezoelectric element 1 of this example is used for an internal-combustion engine, fuel can be injected toward a combustion chamber of the internal-combustion engine such as an engine with higher accuracy for a longer period of time compared to the case of using a conventional injection device.

Figure 12:
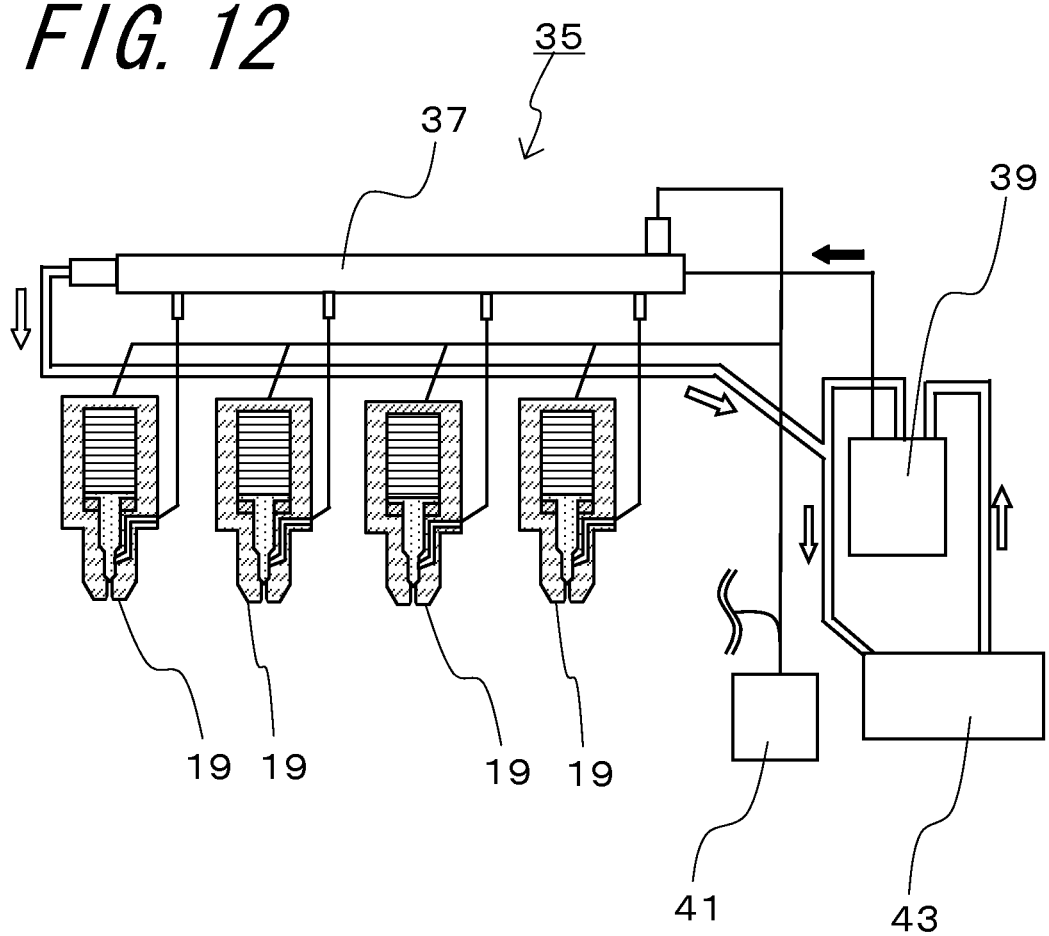
FIG. 12 is a schematic block diagram showing an example of a fuel injection system according to the invention of the invention.

Next, an example of a fuel injection system according to an embodiment of the invention will be described. FIG. 12 is a schematic view showing an example of a fuel injection system according to an embodiment of the invention.

As shown in FIG. 12, the fuel injection system 35 of the example comprises a common rail 37 configured to store high-pressure fuel as high-pressure fluid, a plurality of the injection devices 19 of the example configured to inject the high-pressure fluid stored in the common rail 37, a pressure pump 39 configured to supply the high-pressure fluid to the common rail 37, and an injection control unit 41 configured to send a driving signal to the injection devices 19.

The injection control unit 41 controls an amount of injection of the high-pressure fluid and timing of fluid injection on the basis of external information or external signals. For example, in the case of using the fuel injection system 35 for injection of fuel into an engine, it is possible to control the amount of fuel injection and the timing of fuel injection while detecting the condition of the interior of the combustion chamber of the engine. The pressure pump 39 plays a role of supplying liquid fuel from a fuel tank 43 to the common rail 37 under high pressure. For example, in the fuel injection system 35 for use in engine application, liquid fuel is fed to the common rail 37 under high pressure of about 1000 to 2000 atmospheres (about 101 MPa to about 203 MPa), and preferably high pressure of about 1500 to 1700 atmospheres (about 152 MPa to about 172 MPa). The common rail 37 stores therein the high-pressure fuel from the pressure pump 39 and acts to feed it to the injection device 19 on an as needed basis. As has already been described, the injection device 19 injects fluid in a certain amount to the exterior of the device or into an adjacent container through the injection hole 21. For example, in the case where an engine is a target of fuel supply by injection, high-pressure fuel in fine-spray form is injected into the combustion chamber of the engine through the injection hole 21.

It is to be understood that the application of the invention is not limited to the specific embodiments described heretofore, and that various changes and modifications can be made without departing from the gist of the invention. For example, although two external electrodes 6 in the multi-layer piezoelectric element 1 are respectively formed on two opposing side faces of the stacked body 5 in the above-described example, two external electrodes 6 may be formed on adjacent side faces of the stacked body 5 or may be formed on the same side face of the stacked body 5. Furthermore, while, in the foregoing examples, the stacked body 5 has a rectangular sectional profile as viewed in a direction perpendicular to the stacked direction, the sectional profile may be defined by a polygon such as a hexagon or octagon, a circle, or a combination of a straight line and an arc, instead.

For example, the multi-layer piezoelectric element 1 of the example is used for a piezoelectric driving element (piezoelectric actuator), a pressure sensor element, a piezoelectric circuit element, and so forth. Examples of the driving element include a fuel injection device for an automotive engine, a liquid injection device such as an ink-jet system, a precise positioning device such as an optical device, and an anti-vibration device. Examples of the sensor element include a combustion pressure sensor, a knocking sensor, an acceleration sensor, a load sensor, an ultrasound sensor, a pressure-sensing element, and a yaw-rate sensor. Examples of the circuit element include a piezoelectric gyroscope, a piezoelectric switch, a piezoelectric transformer, and a piezoelectric breaker.

EXAMPLES

Hereinafter, examples of the multi-layer piezoelectric element of the invention will be described.

A piezoelectric actuator provided with the multi-layer piezoelectric element of the invention was manufactured as follows. First, a calcined powder of piezoelectric ceramics containing, as a main component, lead zirconate titanate (PZT: $PbZrO_3$—$PbTiO_3$) having an average particle size of 0.4 μm, a binder, and a plasticizer were mixed to prepare a ceramic slurry. This ceramic slurry was formed into piezoelectric ceramic green sheets having a thickness of 100 μm for forming piezoelectric layers, using the doctor blade method.

Furthermore, a silver-palladium alloy and a binder were mixed to prepare an internal electrode layer conductive paste (first conductive paste) for forming internal electrode layers and electrode extended portions. The silver-palladium ratio at that time was silver 95%:palladium 5% by mass.

Furthermore, a silver-palladium alloy and a binder were mixed to prepare a stress relaxing layer paste (third conductive paste) for forming stress relaxing layers. The silver-palladium ratio at that time was silver 99%:palladium 1% by mass.

Next, the internal electrode layer conductive paste (the first conductive paste) was printed using screen printing in the pattern shown in FIG. 3 on one face of a first piezoelectric ceramic green sheet.

It is noted that a second conductive paste having the same composition as the internal electrode layer conductive paste (the first conductive paste) was also printed in the pattern for forming a dummy internal electrode layers on the first piezoelectric ceramic green sheet at a portion that was to be formed into a periphery portion of a stacked body corresponding to a portion that was to be removed in shaping processing after the firing.

Furthermore, the stress relaxing layer paste (the third conductive paste) was printed using screen printing in the pattern shown in FIG. 4 on one face of another second piezoelectric ceramic green sheet.

One second piezoelectric ceramic green sheet on which the stress relaxing layer paste (the third conductive paste) had been printed was laminated at every 20 first piezoelectric ceramic green sheets on which the internal electrode layer conductive paste (the first conductive paste) and the second conductive paste had been printed. In this example, 300 first piezoelectric ceramic green sheets on which the internal electrode layer conductive paste (the first conductive paste) and the second conductive paste had been printed, and 15 second piezoelectric ceramic green sheets on which the stress relaxing layer paste (the third conductive paste) had been printed were laminated.

Furthermore, these sheets were fired at 980 to 1100° C. and a stacked body was obtained. Shaping processing was performed in which the obtained stacked body was ground into a predetermined shape using a surface grinder. At that time, the portion on which the second conductive paste had been printed to form a dummy internal electrode layer was ground and removed from the stacked body together with the periphery portion of the piezoelectric layers.

Next, a silver-glass paste prepared by mixing a silver powder, glass, a binder, and a plasticizer was printed on side faces of the stacked body in the pattern of external electrode, and baking was performed at 700° C., to form external electrodes. Then, lead wires as outer lead members were connected and fixed to the external electrodes using a solder as conductive bonding members.

In this manner, a multi-layer piezoelectric element of the example (Sample No. 1) was manufactured in which internal electrode layers were not exposed on side faces of the stacked body, but stress relaxing layers exposed on the side faces of the stacked body.

At that time, in the stress relaxing layer, metal portions containing silver as a main component were distributed independently of each other in the form of islands. The average size of the independent metal portion was 2 μm.

Furthermore, the void fraction of the stress relaxing layer was 60%. Meanwhile, the void fraction of the internal electrode was 10%. Here, the void fraction was obtained as follows: cutting the stacked body along a cross-section parallel to the stacked direction, mirror-finishing the cross-section, photographing the cross-section using a metallographic microscope, and obtaining the area ratio of voids in the field of vision, to calculate the void fraction.

Furthermore, as a comparative example 1, a stacked body was produced in which no stress relaxing layer was laminated and internal electrode layer was exposed on side faces thereof, and the side faces of the stacked body were coated with a silicone resin, and a multi-layer piezoelectric element (Sample No. 2) was manufactured.

Furthermore, as a comparative example 2, a stacked body was produced in which no stress relaxing layer was laminated and no internal electrode layer was exposed on side faces thereof, and a multi-layer piezoelectric element (Sample No. 3) was manufactured.

Next, polarizing treatment on the piezoelectric layers was performed in which a direct electric field of 3 kV/mm was applied for 15 minutes via the outer lead members to the external electrodes of the multi-layer piezoelectric elements of Sample Nos. 1 to 3.

An alternating-current voltage of 0 V to +160 V was applied to the multi-layer piezoelectric elements of Sample Nos. 1 to 3 in an atmosphere of 150° C. and at a frequency of 150 Hz, and a durability test that performed continuous driving operation 1×10⁷ times was carried out. Table 1 shows the obtained results.

TABLE 1

| Sample No. | Low-rigidity layer | Internal electrode | State after performing driving operation 1 × 10⁷ times |
|---|---|---|---|
| 1 | Provided | Not exposed on side faces | No defects |
| 2 | Not provided | Exposed on side faces and coated with silicone resin | Electric discharge occurs on side faces, short circuit occurs, and driving operation stops at 2 × 10⁶ times |
| 3 | Not provided | Not exposed on side faces | Crack occurs in stacked body, short circuit occurs, and driving operation stops at 1 × 10⁶ times |

As shown in Table 1, the multi-layer piezoelectric element of the example of the invention (Sample No. 1) had no defects even after driving operation was continuously performed 1×10⁷ times. The reason for this is as follows. Since the internal electrode layers were not exposed on the side faces of the stacked body, electric discharge could be prevented from occurring on the side faces of the stacked body even when driving operation at a high temperature. Furthermore, since the stress relaxing layers exposed on the side faces of the stacked body were provided, a crack could be selectively caused in the stress relaxing layers by stress that was repeatedly generated by extension and contraction of the stacked body, and, thus, stress on the stacked body could be relaxed. Accordingly, a crack did not occur in the piezoelectric layers or the internal electrode layers.

On the other hand, in the case of the multi-layer piezoelectric element of the comparative example 1 (Sample No. 2), the silicone resin coated on the side faces of the stacked body deteriorated by oxidation during use at a high temperature, and, thus, the adhesion to the side faces of the stacked body was lost and the silicone resin was peeled off, and electric discharge occurred between the internal electrode layers exposed on the side faces of the stacked body causing a short circuit and consequently causing a spark. Accordingly, the operation of the element stopped when driving operation was continuously performed 2×10⁶ times.

Furthermore, in the case of the multi-layer piezoelectric element of the comparative example 2 (Sample No. 3), stress that was repeatedly generated by extension and contraction of the stacked body could not be withstood, and a crack that occurred from a side face of the piezoelectric layer grew to pass through the internal electrode layers, and, thus, a short circuit occurred inside the stacked body causing a spark. Accordingly, the operation of the element stopped when driving operation was continuously performed 1×10⁶ times.

Next, a piezoelectric element (Sample No. 4) was manufactured as in Sample No. 1, except that slits were provided in the external electrodes in portions corresponding to the stress relaxing layers. The slits were each formed throughout the entire external electrode in the width direction so as to have a depth of ½ the thickness of the external electrode from the surface thereof, and a width of 30 μm.

An alternating-current voltage of 0 V to +160 V was applied to the multi-layer piezoelectric element of Sample No. 4 in a similar manner in an atmosphere of 150° C. and at a frequency of 150 Hz. When driving operation was continuously performed 5×10⁷ times, no defects were particularly observed.

Next, a multi-layer piezoelectric element (Sample No. 5) was formed as in Sample No. 1, except that stress relaxing layers were manufactured in the pattern shown in FIG. 7(a).

An alternating-current voltage of 0 V to +160 V was applied to the multi-layer piezoelectric element of Sample No. 5 in a similar manner in an atmosphere of 150° C. and at a frequency of 150 Hz. When driving operation was continuously performed 5×10⁷ times, no defects were particularly observed.

Next, a multi-layer piezoelectric element (Sample No. 6) was manufactured as in Sample No. 1, except that outer lead members of the example shown in FIG. 10(c) were bonded to the surfaces of the external electrodes using, as the conductive bonding members, a polyimide resin in which a silver powder was distributed.

An alternating-current voltage of 0 V to +160 V was applied to the multi-layer piezoelectric element of Sample No. 6 in a similar manner in an atmosphere of 150° C. and at a frequency of 150 Hz. When driving operation was continuously performed 5×10⁷ times, no defects were particularly observed.

REFERENCE SIGNS LIST

1: Multi-layer piezoelectric element
2: Piezoelectric layer
3: Internal electrode layer
3A: Electrode extended portion
4: Stress relaxing layer
4A: Non-formed region
5: Stacked body
6: External electrode
7: Slit
8: Conductive bonding member
9: Outer lead member
10: Lead wire
11: Lead wire connecting member
19: Injection device
21: Injection hole
23: Housing (Container)
25: Needle valve
27: Fluid passage
29: Cylinder
31: Piston
33: Disc spring
35: Fuel injection system
37: Common rail
39: Pressure pump
41: Injection control unit
43: Fuel tank

What is claimed is:
1. A multi-layer piezoelectric element, comprising:
a stacked body in which piezoelectric layers and internal electrode layers are alternately laminated and a stress relaxing layer is disposed at part of portions between the piezoelectric layers; and
an external electrode configured to bond to a side face of the stacked body so as to make electrical connection with the internal electrode layers,
wherein the internal electrode layers are not exposed on the side face except for a region bonded to the external electrode, but the stress relaxing layer exposes on the side face of the stacked body, and wherein the external electrode has a slit formed in a portion of the external electrode corresponding to a location of the stress relaxing layer between the piezoelectric layers.

2. The multi-layer piezoelectric element according to claim 1, wherein the stress relaxing layer contains more voids than the internal electrode layers.

3. The multi-layer piezoelectric element according to claim 1, wherein the stress relaxing layer includes metal portions that are independent of each other.

4. The multi-layer piezoelectric element according to claim 1, wherein a plurality of stress relaxing layers are arranged at a predetermined interval in a stacked direction of the stacked body.

5. The multi-layer piezoelectric element according to claim 1, wherein a non-formed region where the stress relaxing layer is not formed exists between the piezoelectric layers.

6. The multi-layer piezoelectric element according to claim 5, wherein the stress relaxing layer is divided by the non-formed region between the piezoelectric layers.

7. The multi-layer piezoelectric element according to claim 1, wherein an outer lead member is bonded via a conductive bonding member to a surface of the external electrode.

8. An injection device, comprising:
a container comprising an injection hole; and
the multi-layer piezoelectric element according to claim 1, wherein
a fluid stored in the container is configured to be injected through the injection hole by driving operation of the multi-layer piezoelectric element.

9. A fuel injection system, comprising:
a common rail configured to store a high-pressure fuel;
the injection device according to claim 8, configured to inject the high-pressure fuel stored in the common rail;
a pressure pump configured to supply the high-pressure fuel to the common rail; and
an injection control unit configured to send a drive signal to the injection device.

* * * * *